(12) United States Patent
Socheleau et al.

(10) Patent No.: US 10,658,908 B2
(45) Date of Patent: May 19, 2020

(54) INTEGRATED ACTUATOR HOUSING

(71) Applicant: Goodrich Actuation Systems SAS, Buc (FR)

(72) Inventors: Jérôme Socheleau, Vernouillet (FR); Olivier Vanneuville, Brétigny-sur-Orge (FR)

(73) Assignee: GOODRICH ACTUATION SYSTEMS SAS, Buc (FR)

( * ) Notice: Subject to any disclaimer, the term of this patent is extended or adjusted under 35 U.S.C. 154(b) by 0 days.

(21) Appl. No.: 15/905,949

(22) Filed: Feb. 27, 2018

(65) Prior Publication Data

US 2018/0309350 A1 Oct. 25, 2018

(30) Foreign Application Priority Data

Apr. 19, 2017 (EP) ..................... 17305453

(51) Int. Cl.
| | |
|---|---|
| *H05K 7/20* | (2006.01) |
| *B33Y 80/00* | (2015.01) |
| *H02K 11/33* | (2016.01) |
| *H02K 5/18* | (2006.01) |
| *H02K 15/14* | (2006.01) |
| *H02K 5/20* | (2006.01) |
| *H02K 15/00* | (2006.01) |
| *H02K 5/22* | (2006.01) |
| *B33Y 10/00* | (2015.01) |
| *H02K 5/24* | (2006.01) |

(Continued)

(52) U.S. Cl.
CPC ............ *H02K 11/33* (2016.01); *H02K 5/18* (2013.01); *H02K 5/20* (2013.01); *H02K 5/22* (2013.01); *H02K 15/00* (2013.01); *H02K 15/14* (2013.01); *H05K 7/20409* (2013.01); *H05K 7/20436* (2013.01); *B33Y 10/00* (2014.12); *B33Y 80/00* (2014.12); *H02K 5/04* (2013.01); *H02K 5/08* (2013.01); *H02K 5/24* (2013.01)

(58) Field of Classification Search
None
See application file for complete search history.

(56) References Cited

U.S. PATENT DOCUMENTS 6,687,110 B2 * 2/2004 Murray .............. H01H 33/6661
337/142
9,784,256 B2 * 10/2017 Franz ..................... F15B 7/08
(Continued)

FOREIGN PATENT DOCUMENTS

| DE | 102013021745 A1 | 6/2015 |
|---|---|---|
| EP | 3076526 A1 | 10/2016 |
| FR | 2710699 A3 | 4/1995 |

OTHER PUBLICATIONS

Extended European Search Report for International Application No. 17305453.7 dated Sep. 29, 2017, 9 pages.

*Primary Examiner* — Courtney L Smith
(74) *Attorney, Agent, or Firm* — Cantor Colburn LLP

(57) ABSTRACT

There is provided a method of manufacturing a housing configured to hold an actuator and an electronic control unit for the actuator. The method comprises additively manufacturing the housing as a single piece, wherein the housing comprises a central portion configured to house the actuator, and one or more side portions configured to house components of the electronic control unit.

10 Claims, 3 Drawing Sheets

(51) Int. Cl.
*H02K 5/08* (2006.01)
*H02K 5/04* (2006.01)

(56) References Cited

U.S. PATENT DOCUMENTS

| | | | |
|---|---|---|---|
| 2004/0134549 A1* | 7/2004 | Albert | F16H 61/0009 |
| | | | 137/884 |
| 2014/0076154 A1 | 3/2014 | Frick et al. | |
| 2015/0015127 A1* | 1/2015 | Nierlich | H02K 11/33 |
| | | | 310/68 R |
| 2015/0084446 A1* | 3/2015 | Atar | H02K 16/00 |
| | | | 310/43 |
| 2015/0101838 A1 | 4/2015 | Shepard et al. | |
| 2015/0123505 A1* | 5/2015 | Kalev | H02K 7/025 |
| | | | 310/74 |
| 2015/0274280 A1 | 10/2015 | Sheahan, Jr. et al. | |
| 2015/0305198 A1 | 10/2015 | Brandt et al. | |
| 2016/0094104 A1* | 3/2016 | Yamasaki | H02K 5/10 |
| | | | 310/68 D |
| 2016/0101463 A1* | 4/2016 | Snyder | B29C 64/386 |
| | | | 164/438 |
| 2016/0156252 A1* | 6/2016 | Balsiger | H02K 9/20 |
| | | | 310/54 |
| 2016/0201694 A1 | 7/2016 | Vacca et al. | |
| 2017/0063183 A1 | 3/2017 | Shrestha et al. | |
| 2018/0001548 A1* | 1/2018 | Dietrich | B22F 3/1055 |

\* cited by examiner

INTEGRATED ACTUATOR HOUSING

FOREIGN PRIORITY

This application claims priority to European Patent Application No. 17305453.7 filed on Apr. 19, 2017, the entire contents of which is incorporated herein by reference.

FIELD

The present disclosure relates generally to electromechanical actuators in combination with their electronic control units, wherein the housing of the electronic control unit is integrated to the electromechanical actuator housing using additive layer manufacturing, and extends to methods of manufacturing a combined electromechanical actuator and associated electronic control unit using additive layer manufacturing.

BACKGROUND

An electromechanical actuator ("EMA") may be used in many applications, for example to actuate the primary flight control surfaces of an aircraft. In this and other applications, the electromechanical actuator may be housed within a unit and combined with an electronic control unit ("ECU"), which is configured to receive commands (e.g., from an aircraft computer) and process these to cause the electromechanical actuator to extend or retract. Typically, each electromechanical actuator unit may have an associated electronic control unit, and these may be combined in use into a single compact apparatus.

FIG. 1A shows a conventional electronic control unit 10, which may comprise two side portions 12, each housing electronic circuitry for controlling an electromechanical actuator unit 30 (see FIG. 1B). The electronic control unit 10 may further comprise a base portion 14 interconnecting the side portions 12, and comprising a connector 16 to provide power and electronic connections to the electromechanical actuator unit 30. The side portions 12 may comprise one or more connectors 18 to provide power and electronic connections to the electronic control unit 10, e.g., from a power source and/or central controller.

The electronic control unit 10 may comprise a first bracket 20 and a second bracket 22 configured to hold the electromechanical actuator unit 30 in use. A plurality of pins 24 may be positioned on the brackets 20, 22, which may be configured to cooperate with corresponding apertures 38 on the electromechanical actuator unit 30 (see FIG. 1B), so as to hold the electromechanical actuator unit 30 in position.

FIG. 1B shows the electromechanical actuator unit 30 in isolation, which comprises a housing 32 which houses the electric motor of the electromechanical actuator unit 30, and also functions as a heat sink using a plurality of fins 34. The housing 32 may comprise flanges 36 comprising apertures 38 that are each configured to cooperate with a corresponding pin 24 of the electronic control unit 10. The electromechanical actuator unit 30 comprises an actuating member 31 configured to extend and retract so as to actuate a component (e.g., a primary flight control surface of an aircraft).

The electromechanical actuator unit 30 comprises the housing 32, as well as an electromechanical actuator 40 and an end plate 42 that are configured to fasten to the housing 32 (e.g., via a plurality of fasteners 44) and enclose the components (e.g., motor) of the electromechanical actuator 40.

The electromechanical actuator unit 30 further comprises a connector 49 to provide power and electronic connections to the components (e.g., motor) of the electromechanical actuator 40 held within the housing 32, which connector 49 is configured to cooperate with the connector 16 on the electronic control unit 10.

FIG. 1C shows the electromechanical actuator unit 30 combined with the electronic control unit 10, and immediately prior to installing the electromechanical actuator unit 30 within the electronic control unit 10. In use, flanges 36 rest on respective portions of bracket 20, such that the electromechanical actuator 36 is configured to sit within the electronic control unit 10. To prevent unwanted movement of the electromechanical actuator unit 30 in use, pins 24 extends through apertures 38 when the electromechanical actuator unit 30 is installed.

Other types of actuator that use an associated electronic control unit are known, for example an electro-hydrostatic actuator ("EHA"), and these typically require a similar set-up to that shown and described in respect of the electromechanical actuator of FIGS. 1A-1C.

It is desired to provide a combined actuator and associated electronic control unit that has improvements to the connections therebetween, while reducing the weight and size of the combined apparatus.

SUMMARY

In accordance with an aspect of the disclosure, there is provided a method of manufacturing a housing configured to hold an actuator and an electronic control unit for the actuator. The method comprises additively manufacturing the housing as a single piece, wherein the housing comprises a central portion configured to house the actuator, and one or more side portions configured to house components of the electronic control unit.

A plurality of heat exchanger components may be provided that interconnect the one or more side portions with the central portion.

The method may further comprise additively manufacturing the heat exchanger components with the housing such that the heat exchanger components form part of the single piece housing.

The heat exchanger components may comprise one or more channels that lead from a respective side portion to the interior of the central portion, so as to provide one or more pathways for power and/or electronic connections between the electronic control unit and the actuator.

The method may further comprise determining a set of dimensions of the heat exchanger components required to achieve a specific amount of heat dissipation, and additively manufacturing the heat exchanger components with the determined set of dimensions.

The set of dimensions may comprise one or more of a shape, length, width and cross-sectional area of the heat exchanger components.

The method may further comprise additively manufacturing one or more connecting portions that interconnect the side portions with the central portion. Each connecting portion may comprise a channel that leads from a respective side portion to the interior of the central portion, so as to provide a pathway for power and/or electronic connections between the electronic control unit and the actuator.

The actuator may be an electromechanical actuator.

The additive manufacturing techniques disclosed herein may comprise one or more of elective laser melting ("SLM"), direct metal laser sintering ("DMLS"), LaserCusing®, selective laser sintering, rapid manufacturing and electron beam melting. The term "additive manufacturing techniques" may be seen as a generic name for these and other generative processes (cf. ASTM International Standard F2792). The terms "rapid technologies" or "rapid prototyping" may also be used (cf. VDI Standard VDI 3404).

In accordance with an aspect of the disclosure, there is provided a housing configured to hold an actuator and an electronic control unit for the actuator, wherein the housing is a single piece of material.

The housing may have been formed by additive manufacturing the single piece of material, for example using any of the techniques described above.

The housing may further comprise a central portion configured to house the actuator, and one or more side portions configured to house components of the electronic control unit.

The additive manufacturing referred to herein refers to the technique of building a 3D object (in this case the housing) by adding layer-upon-layer of material until the object is formed. This allows complex objects to be formed without the need for a mold. In the present example, the use of additive manufacturing to construct the housing of an actuator has been found to be particularly useful, due to the desire to combine the (previously separate) housings of the electronic control unit and electromechanical actuator.

The housing may further comprise a plurality of heat exchanger components that interconnect the one or more side portions with the central portion. Each heat exchanger component may have a length that is at least 2, 3, 4 or 8 times its smallest width (as defined herein). The use of additive manufacturing to build integral heat exchanger components into the housing (and between the side portion (s) and central portion) has been found to be particularly desirable, due to the intricate and/or delicate nature of these components.

The housing may further comprise one or more connecting portions that interconnect the one or more side portions with the central portion.

The housing may further comprise one or more channels that lead from a respective side portion to the interior of the central portion, so as to provide one or more pathways for power and/or electronic and/or cooling fluid connections between the electronic control unit and the actuator.

The one or more side portions may comprise two side portions located on either side of the central portion. The side portions may have a substantially similar weight, for example the weight of one of the side portions 112 may differ by no more than +/−10%, 5% or 2% of the weight of the other of the side portions 112. This provides a balanced apparatus.

In accordance with an aspect of the disclosure, there is provided an apparatus comprising a housing as described above, wherein the apparatus further comprises an actuator housed within the central portion, and components of the electronic control unit for the actuator housed within the one or more side portions.

BRIEF DESCRIPTION OF THE DRAWINGS

Various embodiments will now be described, by way of example only, and with reference to the accompanying drawings in which.

DETAILED DESCRIPTION

The present disclosure relates to an apparatus aimed at combining the housings of an actuator and its control unit into a single component. In order to achieve this combined housing, additive manufacturing (e.g., additive layer manufacturing) is utilised so that the weight and size of the combined housing is reduced while improving the connections (e.g., mechanical or electrical) between the two components. This builds on the recognition that additive manufacturing can be used to combine the housings, whilst reducing the weight and size to an acceptable level.

In the disclosed design, the housing of an actuator (e.g., surrounding the motor of the actuator) is integrated with the housing of its control unit to make a single part using additive manufacturing. In some embodiments, the actuator and its control unit share a common heat exchanger.

Figure 1A:
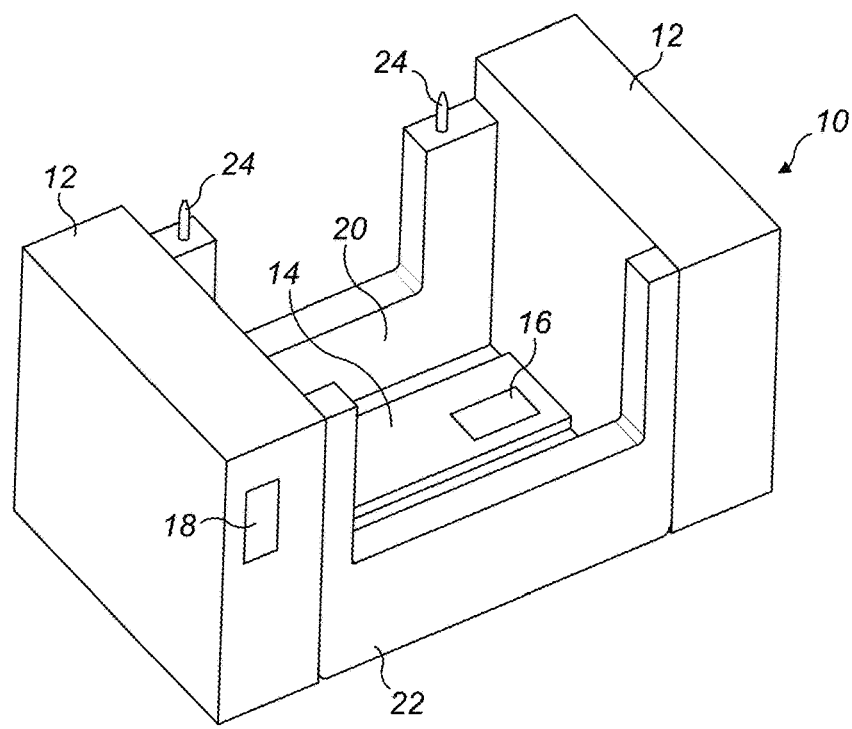
FIG. 1A shows a conventional electronic control unit.
Figure 1B:
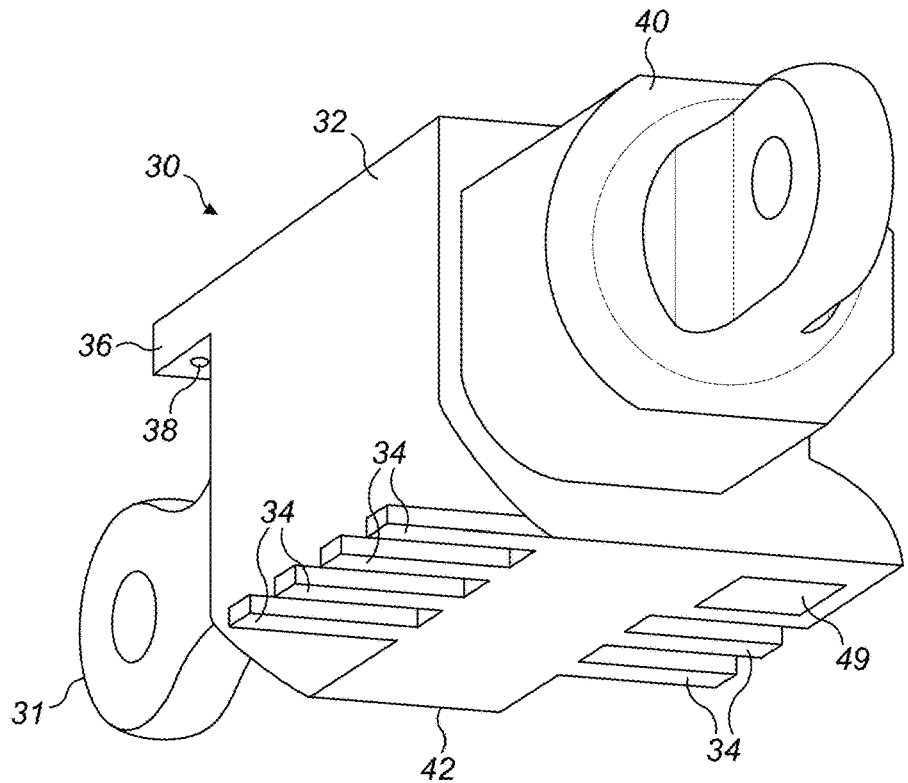
FIG. 1B shows a conventional electromechanical actuator.

Combining the two components may eliminate the requirement for a connector (e.g., an electrical or power connection) to be located on each component (e.g., connectors 16 and 49 in FIGS. 1A and 1B). The combined component may be replaceable as a single unit (e.g., a line replaceable item), which is possible due to the reduced weight achieved by the combined housing and additive layer manufacturing thereof.

In the illustrated embodiments, an electromechanical actuator is described and shown, although equally this could be an electro-hydrostatic actuator ("EHA") or other suitable actuator. The broadest aspects of the present disclosure intended to extend to any type of actuator that conventionally is combined (e.g., connected physically to) a separate electrical control unit.

Figure 2A:
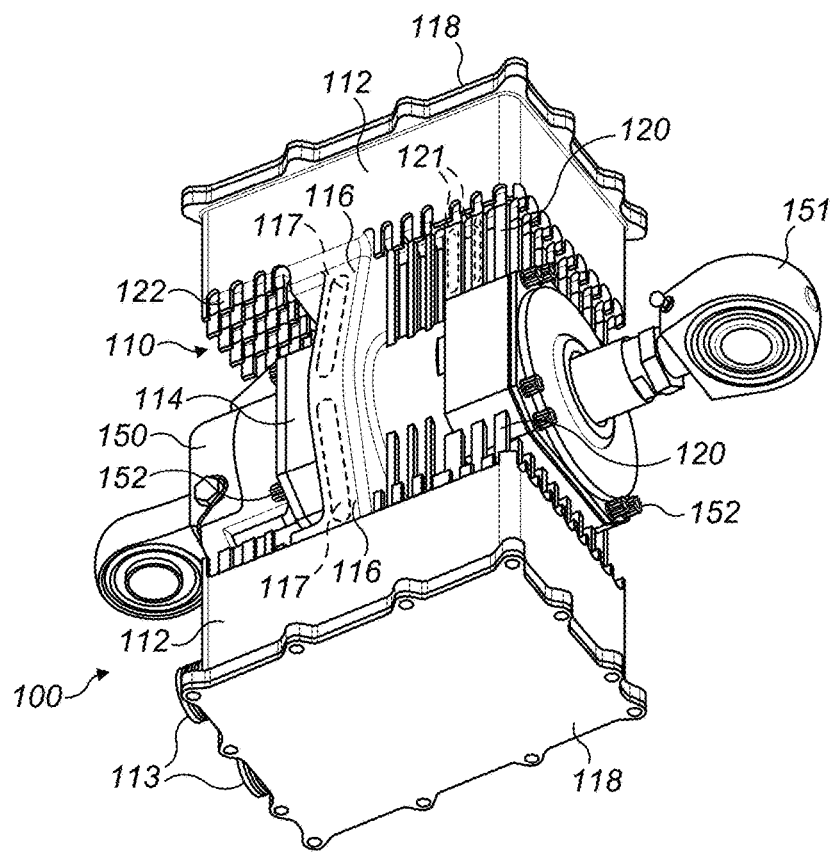
FIG. 2A shows a combined electromechanical actuator and electronic control unit in accordance with an embodiment of the present disclosure.

FIG. 2A shows an apparatus 100 in accordance with the present disclosure. The apparatus 100 comprises a housing 110 that has been additively manufactured as a single piece component. The housing 110 comprises two side portions 112 that each contain control circuitry and other electronics for controlling an electromechanical actuator 150. In other words, the electronic control unit of the electromechanical actuator 150 may be housed within the side portions 112.

The side portions 112 may have a similar weight, for example the weight of one of the side portions 112 may differ by no more than +/−10%, 5% or 2% of the weight of the other of the side portions 112, in order to provide a balanced apparatus 100.

The housing 110 may comprise a central portion 114 that surrounds and encloses an electromechanical actuator 150. The central portion 114 may correspond to the motor housing 32 of the electromechanical actuator unit 30 shown in FIG. 1B. The electromechanical actuator 150 may be connected to the central portion 114 by any suitable means, such as fasteners 152 as shown in FIG. 2A.

The central portion 114 may be connected to the side portions 112 via respective connecting portions 116. Each connecting portion 116 may comprise a channel 117 (not shown) that leads from a respective side portion 112 to the interior of the central portion 114, so as to provide a pathway for power and electronic connections (e.g., cables). This eliminates the need for connectors, such as connectors 16, 49 as shown and described in respect of FIGS. 1A and 1B. One or both of the side portions 112 may comprise connectors 113 to provide power and electronic connections to the apparatus 100, e.g., from a power source and/or central controller.

The central portion 114 may, additionally or alternatively be connected to the side portions 112 via a plurality of heat exchanger components 120, for example fins or needles. The heat exchanger components 120 are configured to dissipate heat from the central portion 114 (e.g., including the electromechanical actuator 150) and each side portion 112. Furthermore, the heat exchanger components 120 may provide a certain amount of structural rigidity to the housing 110, for example in addition to or instead of the connecting portions 116.

The heat exchanger components 120 may be thin and/or elongated, for example each heat exchanger component 120 may have a length (e.g., along its longitudinal axis and/or extending between a respective side portion 112 and the central portion 114) that is at least 2, 4, 6, 8, 10, 20 or 50 times its smallest width. As used herein, the "width" of a component may be referred to as a side to side dimension of the component perpendicular to and coinciding with its longitudinal axis.

In some embodiments the central portion 114 may be connected to the side portions 112 only via the heat exchanger components 120. In this situation, electrical and power connections to the electromechanical actuator 150 may be provided through apertures or other channels 121 within the heat exchanger components 120.

Each side portion 112 may comprise further heat exchanger components 122, for example that do not extend to the central portion 114. Similarly, these may be thin and/or elongated, for example each further heat exchanger component 122 may have a length (e.g., along its longitudinal axis) that is at least 2, 4, 6, 8, 10, 20 or 50 times its smallest width.

The housing 110 may be enclosed at opposed ends by end plates 118. These end plates may be thin (e.g., formed from sheet metal) to reduce weight as much as possible.

In some embodiments, one of the side portions 112 may comprise or house relatively high power electronics, while the other of the side portions 112 may comprise or house relatively low power electronics. For example, in some applications it can be desirable to separate high-power electronics from low-power electronics. Furthermore, it may be desirable to separate the electronics from the motor of the electromechanical actuator 150, for example to prevent overheating. Hence, the use of two side portions 112 either side of a central portion 114, and separated therefrom by heat exchanger components 120 may be seen as an optimum arrangement, especially when additively manufactured as a single piece as described herein.

The electromechanical actuator 150 may be housed within the central portion 114 as described above, such that the various components of the electromechanical actuator 150 are held in position by the central portion 114. An actuating member 151 protrudes from one of the end plates 153 and is configured to extend and retract so as to actuate a component (e.g., a primary flight control surface of an aircraft).

Figure 1C:
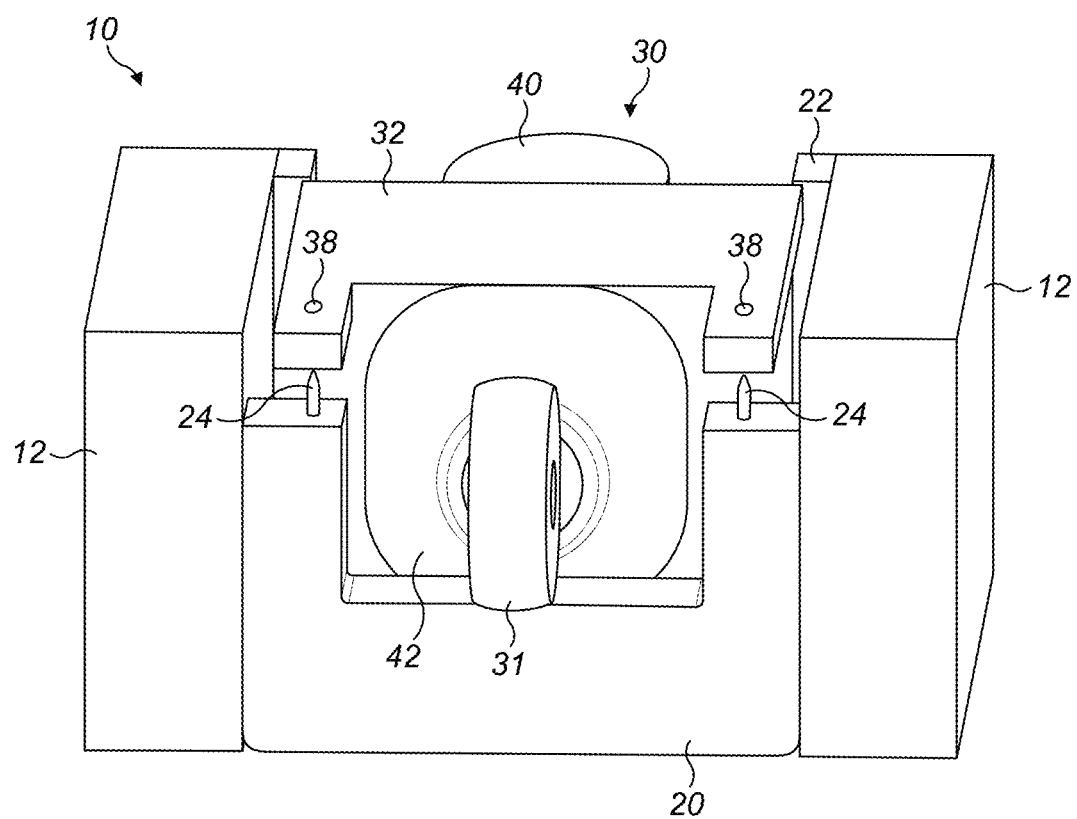
FIG. 1C shows the electronic control unit of FIG. 1A and the electromechanical actuator of FIG. 1B immediately prior to combining the two components as a single unit.

It will be appreciated that the electromechanical actuator 150 may be the same as the electromechanical actuator shown and described in respect of FIGS. 1A-1C, but with the housing 32 replaced by the central portion 114 of housing 110. In other words, the present disclosure relates to improvements in the housing of the electromechanical actuator and electronic control unit, as opposed to the structure of the actuator itself (which may remain the same as required by any particular application).

The broadest aspects of the present disclosure relate the recognition that heat exchanger components may be used to connect the three main housings of an actuator and its electronic control unit through the use of additive manufacturing (e.g., additive layer manufacturing). This provides a solid, single apparatus, while reducing complexity (e.g., connectors, brackets, etc.) as well as weight and size.

The present disclosure extends to methods of manufacturing a housing (e.g., housing 110) configured to hold an actuator (e.g., electromechanical actuator 150) and its electronic control unit. The method comprises additively manufacturing the housing as a single piece, wherein the housing comprises a central portion (e.g., central portion 114) configured to hold the actuator, and one or more side portions (e.g., two side portions 112) configured to hold components of the electronic control unit for the actuator, wherein the central portion is connected to each side portion by respective heat exchanger components (e.g., heat exchanger components 120).

The present disclosure also extends to methods of re-engineering an existing actuator (e.g., actuator 40 of FIG. 1B) and its electronic control unit (e.g., electronic control unit 10 of FIG. 1A), the method comprising additively manufacturing a housing (e.g., housing 110) as a single piece, wherein the housing comprises a central portion configured to house the existing actuator, and one or more side portions configured to house components of its electronic control unit. The method may comprise removing the existing actuator from its housing (e.g., housing 32 in FIG. 1B), and inserting the existing actuator into the additively manufactured housing. The method may further comprise removing components of the existing electronic control unit (see, e.g., FIG. 1A), inserting them into the side portions and operatively connecting the components to the existing actuator now held within the additively manufactured housing.

The methods may comprise additively manufacturing connecting portions (e.g., connecting portions 116) that interconnect the side portions with the central portion. Each connecting portion may be additively manufactured so as to comprise a channel (e.g., channels 117) that leads from a respective side portion to the interior of the central portion, so as to provide a pathway for power and/or electronic connections. Additionally, or alternatively the method may comprise additively manufacturing the heat exchanger components so as to comprise one or more channels (e.g., channels 121) that lead from a respective side portion to the interior of the central portion, so as to provide one or more pathways for power and/or electronic connections.

The methods may comprise operatively connecting the actuator held within the central portion of the additively manufactured housing with the components of the electronic control unit held within the side portion(s), e.g., by providing one or more power and/or electrical connections through the one or more pathways.

In addition to the ease at which additive manufacturing is able to provide a single piece component, the use of additive manufacturing techniques allows the structure of the various components of the housing to be easily tailored for a specific application. For example, the dimensions of the heat exchanger components can be tailored to provide a desired degree of heat dissipation suitable for any particular application.

Accordingly, the method may comprise determining a set of dimensions of the heat exchanger components required to achieve a specific amount of heat dissipation, and additively manufacturing the heat exchanger components with the determined set of dimensions. The set of dimensions may comprise one or more of a shape, length (e.g., as measured along the longitudinal axis), width (e.g., as defined above) and cross-sectional area of the heat exchanger components.

Technical effects of the present disclosure may include a weight and/or size reduction to the combination of the actuator and its electronic control unit. Also, a reduction is achieved in the number of parts required to produce the apparatus, as well as a reduction in the overall envelope of the actuator. This can lead to an improved reliability and less risk of water ingress or icing issues, as there are no connectors between the housings of the actuator and the electronic control unit. The disclosed apparatus also achieves a better segregation between power signals and control or monitoring signals. The use of a single piece housing also achieves less vibration due to a stiffer connection between the actuator and its electronic control unit. As discussed above, thermal management can be optimised through the use of common heat exchanger components between the actuator and the electronic control unit. There is also less risk of damage during handling operations in the field.

Figure 2B:
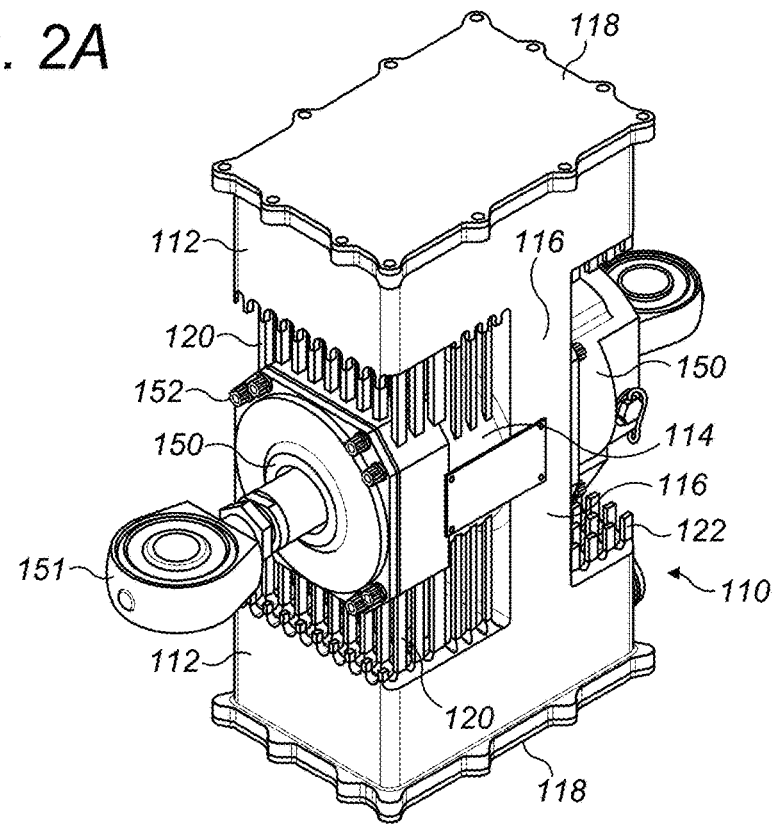
FIG. 2B shows the combined electromechanical actuator and electronic control unit of FIG. 2A from a different angle.

As will be appreciated by a person skilled in the art, the central portion 114 of the electromechanical actuator embeds an electrical motor, which produces heat. In the conventional arrangement shown in FIG. 1, heat exchanger fins 34 are provided on the electromechanical actuator housing 32 in order to dissipate such heat. Similarly, the two side portions 112 of the actuator 100 embed certain electronic devices, such as power switching devices (IGBT, MOSFET, etc.) to drive the motor. These devices also generate some heat which needs to be dissipated externally. Hence, the embodiment of FIGS. 2A and 2B connects the side portions 112 to the central portion 114 through the heat exchanger components 120. Having common heat exchanger components 120 (e.g., fins) for the motor within the central portion 114, and the devices within the side portions 112 leads to improved cooling, which is only possible if the central portion 114 and side portions 112 are manufactured as a single piece. The heat exchanger components 120 may be used to provide improved heat dissipation and a strong mechanical link between the portions, as well as optionally channels 121 to provide one or more pathways for power and/or electronic connections. These effects are made possible due to the use of additive manufacturing to construct the housing 110 as a single piece.

The apertures or other channels 117, 121 described herein for electrical and/or power connections (whether in the connecting portions 116 or the heat exchanger components 120) may also be used to provide fluid transfer, for example the apertures or channels 117, 121 may form part of a cooling circuit or other pathway for cooling fluid. If apertures or channels 117, 121 are provided for cooling, then these would be separate to the apertures or channels 117, 121 provided for electrical and/or power connections. For example, first apertures or channels 117 may be provided in one or both of the connecting portions 116, and second apertures or channels 121 may be provided in the heat exchanger components 120. One of the first and second apertures or channels may house electrical and/or power connections between the side portions 112 and the central portion 114, and the other of the first and second apertures or channels may house pathways for cooling fluid. The pathways for cooling fluid may be provided in the heat exchanger components 120, to enhance the cooling provided by these components 120.

Although the present invention has been described with reference to preferred embodiments, it will be understood by those skilled in the art that various changes in form and detail may be made without departing from the scope of the invention as set forth in the accompanying claims.

The invention claimed is:

1. A method of manufacturing a housing configured to hold an actuator and an electronic control unit for the actuator, the method comprising:
   additively manufacturing the housing as a single piece, wherein the housing comprises a central portion configured to house the actuator, and one or more side portions configured to house components of the electronic control unit;
   wherein a plurality of heat exchanger components are provided that interconnect the one or more side portions with the central portion;
   the method further comprising additively manufacturing the heat exchanger components with the housing such that the heat exchanger components form part of the single piece housing;
   wherein the heat exchanger components comprise one or more channels that lead from a respective side portion to the interior of the central portion, so as to provide one or more pathways for power and/or electronic connections between the electronic control unit and the actuator.

2. A method as claimed in claim 1, further comprising determining a set of dimensions of the heat exchanger components required to achieve a specific amount of heat dissipation, and additively manufacturing the heat exchanger components with the determined set of dimensions.

3. A method as claimed in claim 2, wherein the set of dimensions comprises one or more of a shape, length, width and cross-sectional area of the heat exchanger components.

4. A method as claimed in claim 1, further comprising additively manufacturing one or more connecting portions that interconnect the side portions with the central portion, wherein each connecting portion comprises a channel that leads from a respective side portion to the interior of the central portion, so as to provide a pathway for power and/or electronic connections between the electronic control unit and the actuator.

5. A method as claimed in claim 1, wherein the actuator is an electromechanical actuator ("EMA").

6. A housing configured to hold an actuator and an electronic control unit for the actuator, wherein the housing is a single piece of material, wherein the housing comprises:
   a central portion configured to house the actuator; and
   one or more side portions configured to house components of the electronic control unit;
   wherein the housing has been formed by additive manufacturing the single piece of material;
   wherein the housing further includes a plurality of heat exchanger components that interconnect the one or more side portions with the central portion, wherein the heat exchanger components are additively manufactures within the housing such that the heat exchanger components form part of the single piece housing;
   wherein the heat exchanger components comprise one or more channels that lead from a respective side portion to the interior of the central portion, so as to provide one or more pathways for power or electronic connections between the electronic control unit and the actuator.

7. A housing as claimed in claim 6, wherein each heat exchanger component has a length that is at least four times its smallest width.

8. A housing as claimed in claim 6, further comprising one or more connecting portions that interconnect the one or more side portions with the central portion.

9. A housing as claimed in claim 6, wherein the one or more side portions comprises two side portions located on either side of the central portion.

10. An apparatus comprising:
the housing as claimed in claim 6;
the actuator housed within the central portion; and
the components of the electronic control unit for the actuator housed within the one or more side portions.

* * * * *